(12) United States Patent
McCullough

(10) Patent No.: US 7,013,555 B2
(45) Date of Patent: Mar. 21, 2006

(54) METHOD OF APPLYING PHASE CHANGE THERMAL INTERFACE MATERIALS

(75) Inventor: Kevin A. McCullough, North Kingstown, RI (US)

(73) Assignee: Cool Shield, Inc., Warwick, RI (US)

( * ) Notice: Subject to any disclaimer, the term of this patent is extended or adjusted under 35 U.S.C. 154(b) by 290 days.

(21) Appl. No.: 10/224,161

(22) Filed: Aug. 20, 2002

(65) Prior Publication Data

US 2003/0041442 A1     Mar. 6, 2003

Related U.S. Application Data

(60) Provisional application No. 60/316,470, filed on Aug. 31, 2001.

(51) Int. Cl.
*H05B 3/00* (2006.01)

(52) U.S. Cl. .............................. 29/611; 29/620; 29/632; 29/890.03; 29/890.032; 156/306.3; 257/E23.089; 257/E23.107; 438/781; 438/782

(58) Field of Classification Search ................. 29/611, 29/620, 632, 890.03, 890.032; 257/E23.089, 257/E23.107; 438/781, 782; 156/306.3
See application file for complete search history.

(56) References Cited

U.S. PATENT DOCUMENTS

| | | | |
|---|---|---|---|
| 4,092,192 A | * | 5/1978 | Magyari ........................ 156/69 |
| 4,900,877 A | | 2/1990 | Dubrow et al. |
| 4,938,279 A | | 7/1990 | Betker |
| 4,948,922 A | | 8/1990 | Varadan et al. |
| 4,999,741 A | | 3/1991 | Tyler |
| 5,061,566 A | | 10/1991 | Morgan |
| 5,115,104 A | | 5/1992 | Bunyan |
| 5,187,225 A | | 2/1993 | Kitagawa |
| 5,276,586 A | * | 1/1994 | Hatsuda et al. ............. 361/705 |
| 5,315,480 A | | 5/1994 | Samarov et al. |
| 5,430,609 A | | 7/1995 | Kikinis |

(Continued)

*Primary Examiner*—A. Dexter Tugbang
*Assistant Examiner*—Tim Phan
(74) *Attorney, Agent, or Firm*—Barlow, Josephs & Holmes, Ltd.

(57) ABSTRACT

The present invention discloses a method of providing an integral thermal interface on an interface surface of a heat dissipation device, such as a heat sink. In accordance with the present invention, the phase change material is applied directly onto the interface surface of the heat sink to form an integral interface layer directly on the heat sink during the manufacturing process. This process includes the steps of providing a heat dissipating device having an interface surface, liquefying the phase change material at a controlled temperature so as to decrease the material viscosity to a flowable form, applying the liquefied phase change material directly onto the mating surface of the heat dissipating device either by directly dispensing the material, screen printing or stencil printing and cooling the material causing it to cure on the surface of the heat dissipating device.

5 Claims, 1 Drawing Sheet

U.S. PATENT DOCUMENTS

| | | |
|---|---|---|
| 5,440,172 A | 8/1995 | Sutrina |
| 5,513,070 A | 4/1996 | Xie et al. |
| 5,552,960 A | 9/1996 | Nelson et al. |
| 5,557,500 A | 9/1996 | Baucom et al. |
| 5,572,070 A | 11/1996 | Ross |
| 5,660,917 A | 8/1997 | Fujimori et al. |
| 5,738,936 A * | 4/1998 | Hanrahan ............... 428/313.5 |
| 5,781,412 A | 7/1998 | de Sorgo |
| 5,790,376 A | 8/1998 | Moore |
| 5,910,524 A | 6/1999 | Kalinoski |
| 6,204,303 B1 | 3/2001 | Osuna et al. |
| 6,210,520 B1 * | 4/2001 | Osuna et al. ............ 156/306.3 |
| 6,286,212 B1 * | 9/2001 | Eaton ..................... 29/890.03 |
| 6,348,654 B1 | 2/2002 | Zhang et al. |
| 6,410,137 B1 | 6/2002 | Bunyan |

\* cited by examiner

METHOD OF APPLYING PHASE CHANGE THERMAL INTERFACE MATERIALS

CROSS-REFERENCE TO RELATED APPLICATIONS

This application is related to and claims priority from earlier filed provisional patent application No. 60/316,470 filed Aug. 31, 2001.

BACKGROUND OF THE INVENTION

The present invention relates generally to a method of applying an electronic material composition to an interface surface for use in connection with heat generating electronic devices. More particularly, this invention relates to a new method of applying a phase change thermal interface material to the contact surface of a heat dissipation device such as a heat sink.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips generate a great deal of heat during operation, which must be removed to prevent adverse effects on operation of the system into which the device is installed. In the prior art, heat sinks are commonly placed in thermal communication with the heat-generating device to help dissipate heat therefrom, to avoid the above-described adverse effects due to overheating. Heat sinks are often placed and maintained in direct communication with the heat-generating surface of the device to be cooled.

It is well known that the most critical locations that effect the overall performance of these heat transfer assemblies are the interface points. These locations are where two different materials mate to one another introducing two contact surfaces and often an air gap across which the heat being dissipated must be transferred. Generally, the contact surfaces are not always perfectly flat due to milling or manufacturing tolerances thus creating gaps between the heat generating surface and the heat dissipating devices thereby increasing the overall thermal resistance of the assembly. These imperfections and gaps between the mating surfaces often contain small pockets of air and thus reduce the heat transfer potential across the interface between the heat generating surface and the heat-dissipating device.

Various materials have been employed in the prior art in an attempt to bridge this interface gap. In particular, organic base materials such as polysiloxane oils or polysiloxane elastomeric rubbers and thermoplastic materials such as PVC, polypropylene, etc. loaded with thermally conducting ceramics or other fillers such as aluminum nitride, boron nitride or zinc oxide have been used to impart thermally conducting properties to the organic base material. In the case of polysiloxane oils loaded with thermally conducting materials, these materials are applied by smearing the heat sink or other electronic component with the thermally conducting paste and then securing the heat sink in place by mechanical means using clips or screws. The prior art, thermal greases show superior film forming and gap filling characteristics between uneven surfaces thus providing an intimate contact between the surface of the heat sink and the surface of the heat-generating source. However, it has been found that the use of thermal greases exhibit poor adhesions to the surfaces of the heat sink and heat generating surface, thus effectively seeping out from between the heat sink and the heat generating surface, causing air voids to form between the two surfaces, ultimately leading to hot spots. Moreover, excessive pressure placed upon the heat sink by the mechanical fasteners accelerates this seepage from between the heat sink and the surface of the heat-generating surface. It has been reported that excessive squeeze out of polysiloxane oils can evaporate and recondense on sensitive parts of the surrounding microcircuits. The recondensed oils lead to the formation of silicates thereby interfering with the function of the microprocessor and eventually causing failure.

In the case of polysiloxane rubbers and thermoplastic polymers, these materials are typically cast in sheet form and die cut into shapes corresponding to the shape of the heat sink and heat generating device. The resulting preformed sheet is then applied to the surface of the heat-generating surface securing the heat sink by means of clips or screws. The precut films solve the problems associated with greases but do not provide adequate intimate contact required for optimum heat transference between the heat generating source and the heat sink. However, the precut films, often of a phase change material, do not always wet out completely against the surface of the heat dissipation device and the added step of cutting preforms and manually applying the pad adds cost to the assembly process in addition to increasing waste and potential error, as these precut pads tend to be quite fragile. Furthermore, these types of materials show variable performance due to variation in the thickness of the pad and the amount of pressure applied to the thermally conducting precut film, based upon the mechanical device or action used to secure the heat sink.

Therefore, in view of the foregoing, heat transfer assemblies that include integral thermal transfer interfaces for mating the assembly to a heat-generating surface are highly desired. There is also a demand for a heat dissipating assembly for use in an electronic device that is lightweight, has an integral interface surface with gap bridging properties and a reduction in interface material waste when applied to heat dissipation devices having complex geometries.

SUMMARY OF THE INVENTION

The present invention is generally directed to a method of providing an integral thermal interface on an interface surface of a heat dissipation device, such as a heat sink, thereby eliminating a required assembly step. In accordance with the present invention, the traditional phase change material that in the prior art is applied to a backer film, precut to the shape of the interface surface and subsequently transferred to the desired surface is instead applied directly onto a surface. This process therefore eliminates the additional steps of application of the interface onto a film, die cutting and transferring while also eliminating the waste associated with the die cutting step.

By way of example, the present invention operates as follows, during the manufacturing process of a heat-dissipating device; the phase change material is applied directly onto the interface surface of the heat sink to form an integral interface layer directly on the heat sink. This process includes the steps of providing a heat dissipating device having an interface surface, liquefying the phase change material at a controlled temperature so as to decrease the material viscosity to a flowable form, applying the liquefied phase change material directly onto the mating surface of the heat dissipating device either by directly dispensing the material, screen printing or stencil printing and cooling the material causing it to cure on the surface of the heat dissipating device.

The present invention provides several distinctive advantages over the die-cut sheets of the prior art. First, the material is directly applied to the heat sink at the time of manufacture, eliminating the need for an additional assembly step of removing a die cut sheet and applying the material onto the device, thereby eliminating unnecessary handling of the fragile material and reducing the potential for contamination of the interface material. The need for an adhesive layer to attach the die cut material to the heat sink is also eliminated, as the material is already adhered to the heat sink device. Second, a great deal of waste is reduced in cases where the mating surface of the heat dissipating device is irregular, because only the material necessary to cover the surface is applied to the surface. In contrast, when die cut sheets are used, the overhanging material is trimmed after application and discarded. Finally, a more complete wet out of the part is achieved. Since the material is applied in its molten state, it flows onto the part and fills the voids and manufacturing imperfections on the interface surface more completely, resulting in virtual elimination of any voids or air gaps thereby providing more intimate thermal communication.

The heat sink device is then assembled onto a heat generating electronic device and retained there using any fastening device well known in the art. The present invention therefore provides a lower cost alternative for employing a thermal interface of phase change material while further simplifying assembly by eliminating several steps required in the prior art.

It is therefore an object of the present invention to provide a method of manufacturing a heat dissipation device having an integral phase change thermal interface.

It is also an object of the present invention to provide a method of manufacturing a heat dissipation device having a pre applied phase change thermal interface thereby eliminating the need for applying an interface pad during final installation of the device.

It is a further object of the present invention to provide a method of manufacturing a heat sink assembly with a preapplied thermal interface pad where complete wet out of the interface surface of the heat sink is accomplished at the time of manufacture thereby eliminating any voids or air gaps between the interface pad and the interface surface.

It is yet another object of the present invention to provide a method of manufacturing a heat sink as described above that eliminates the need for a layer of adhesive between the interface pad and the interface surface of the heat sink.

It is a further object of the present invention to provide a method of manufacturing a heat sink having an interface pad on an interface surface there of that eliminates the need for trimming excess material thereby reducing material waste and accommodating complex geometries and a variety of heat sink interface shapes.

Other objects, features and advantages of the invention shall become apparent as the description thereof proceeds when considered in connection with the accompanying illustrative drawings.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE INVENTION

Figure 1:
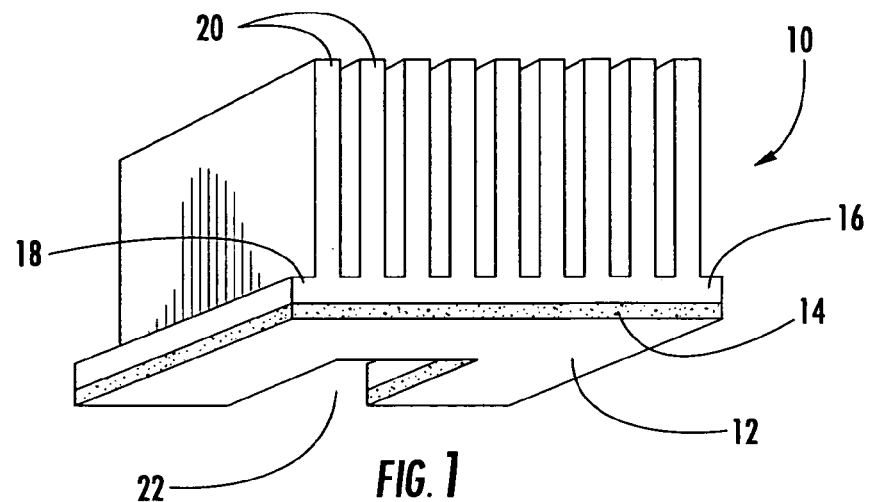
FIG. 1 is a perspective view of a heat dissipation device prepared in accordance with the method of the present invention.
Figure 2:
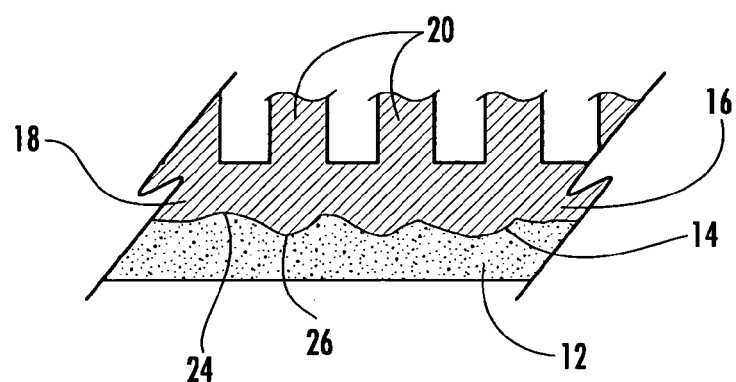
FIG. 2 is a magnified cross-sectional view of the interface portion of the heat dissipation device of FIG. 1.
Figure 3:
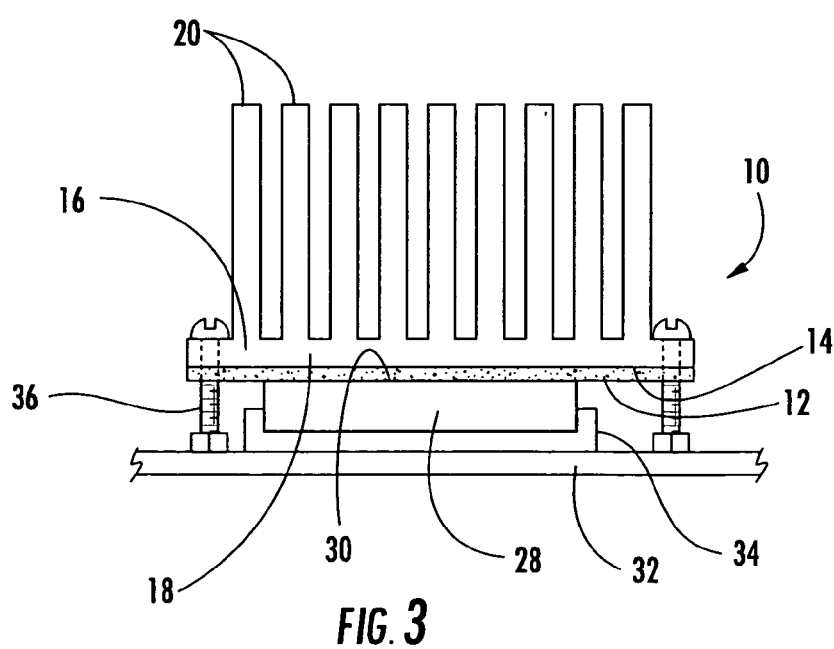
FIG. 3 is a front elevational view of a heat dissipation assembly prepared in accordance with the method of the present invention.

Referring now to the drawings, examples of assemblies manufactured in accordance with the method of the present invention are illustrated and generally shown in FIGS. 1–3. The present invention discloses a method of manufacturing a heat dissipation assembly 10 and particularly provides a method of applying an integral thermal interface layer 12 of phase change material onto the contact surface 14 of a heat sink device 16. In accordance with the method of the present invention, a heat-dissipating device 16 such as a heat sink 16 is provided. The heat sink 16 generally includes an interface surface 14 on a base member 18 and surface area enhancements 20 protruding from the base member 18 opposite the interface surface 14. The phase change material 12 is applied directly onto the interface surface 14 of the heat sink 16 to form an integral thermal interface layer/gap pad 12 directly on the interface surface 14 of the heat sink 16. This process includes the steps of providing a heat dissipating device 16 having an interface surface 14, liquefying the phase change material 12 at a controlled temperature so as to decrease the material viscosity to a flowable form, applying the liquefied phase change material 12 directly onto the interface surface 14 of the heat dissipating device 16 and cooling the material 12 causing it to cure on the surface 14 of the heat dissipating device 16.

The phase change material 12 may be applied to the interface surface 14 of the heat sink 16 either by directly dispensing the material 12, screen-printing or stencil printing. By applying the liquefied phase change material 12 in this manner, the geometric shape and thickness of the material 12 can be carefully controlled. Through stencil and screen printing methods, the interface material 12 can be applied to the contact surfaces 14 of heat sinks 16 having complex geometries with a great deal of repeatability and precision. Further, in contrast to the methods in the prior art, only the precise amount of material 12 required to cover the contact surface 14 is applied, greatly reducing waste and eliminating the trimming step required for the removal of excess material. As can be best seen in FIG. 1 the interface material 12 can be placed directly onto the U-shaped interface 14 of the heat sink 16 with out requiring trimming of the excess interface material from the indentation 22 as would have been required in the prior art.

Turning to FIG. 2, a magnified view of the interface between the contact surface 14 of the heat sink 16 and the phase change material 12 is shown. The step of liquefying and applying the phase change material 12 in a molten state is an important feature of the present invention. While the contact surface 14 of the heat sink appears to be smooth, in reality, in this magnified view, the contact surface 14 can be seen to include many surface imperfections that are the result of milling, polishing or molding of the heat sink device 16. In the prior art, the heat sink would be applied directly to a heat generating surface resulting in numerous small air gaps that would interfere with the efficiency of the heat transfer across the interface. Since the phase change material 12 is applied to the contact surface 14 of the heat sink 16 in a molten state in accordance with the present invention, the molten phase change material 12 will flow over the contact surface 14 filling the voids 24 and accommodating the ridges 26. Therefore, when the heat sink 16 is manufactured in accordance with the method of the present invention the raised ridges 26 and depressed areas 24 are filled with phase change material 12, eliminating the voids and air gaps. Also, since the phase change material 12 is applied in a molten state and is cured directly on the contact surface 14 of the heat sink 16, it naturally adheres to the heat sink 16. This eliminates the requirement of an adhesive layer between the phase change material 12 and the contact surface 14 of the heat sink 16 further lowering the overall thermal resistivity of the assembly and reducing required assembly time.

Turning now to FIG. 3, an assembly manufactured in accordance with the method of the present invention 10 is shown. The heat sink 16 is shown, after having the phase change thermal interface 12 applied as described above, installed onto a heat generating electronic component 28. The electronic component 28 has a heat-generating surface 30 onto which the contact surface 14 of the heat sink 16 and the interface material 12 is placed in thermal communication. The heat generating device 28 is generally mounted on a circuit board 32 using integrally formed wire leads 34, pin grid arrays, ball grid arrays or any conventional mounting means well known in the art. The heat sink 16 is further fastened using fasteners 36 such a screws to hold it in firm contact with the electronic device 28. This allows the interface 12 to be held in firm contact and thermal communication with the heat-generating surface 30. In addition to screws 36, a variety of fastening means may be employed such as clips springs, adhesives or other mechanical fasteners.

The present invention may also include a step whereby adhesive material is incorporated within the molten phase change material 12 before it is applied to the contact surface 14 of the heat sink 16. This provides a thermal interface surface 12 that includes integral adhesive properties, eliminating the need for mechanical fasteners or the addition of an adhesive layer over the thermal interface material 12.

In view of the foregoing, a superior method for manufacturing and applying a phase change thermal interface to a heat dissipating assembly that eliminates the requirement of additional gap pads or thermal interfaces can be realized. The method of the present invention, greatly improves over prior art attempts by integrally providing a heat sink 12 with a thermal interface that is applied at the time of manufacture. This eliminates additional assembly steps and reduces the amount of waste material generated as compared to the processes in the prior art. In particular, the present invention 10 provides a method of manufacturing a heat sink 16 with an integrated thermal interface 12 that is vastly improved over known assemblies and was until now unavailable in the prior art.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A method of applying a phase change thermal interface to a contact surface of a heat-dissipating device comprising the following steps in the order listed:
   first providing a heat-dissipating device having a contact surface and a thermoplastic polymer phase change material in a solid state;
   second heating said solid state phase change material to liquefy said material;
   third applying said liquefied phase change material to said contact surface; and
   fourth cooling said liquefied phase change material, wherein said cooling allows said liquefied phase change material to return to said solid state, thereby forming a solid fully cured thermal interface layer on said contact surface, wherein said thermal interface layer remains solid throughout the normal operating lifetime of said thermal interface.

2. The method of applying a phase change thermal interface of claim 1, wherein said step of providing a heat-dissipating device is providing a heat sink.

3. The method of applying a phase change thermal interface of claim 1, wherein said step of applying said liquefied phase change material further includes screen printing said liquefied phase change material.

4. The method of applying a phase change thermal interface of claim 1, wherein said step of applying said liquefied phase change material further includes stencil printing said liquefied phase change material.

5. The method of applying a phase change thermal interface of claim 1, further comprising:
   installing said heat dissipating device onto a heat generating electronic component having a heat generating surface, said applied phase change material being in thermal communication with said heat generating surface, after said step of cooling said applied phase change material.

* * * * *